US011217631B2

(12) United States Patent
Lee

(10) Patent No.: US 11,217,631 B2
(45) Date of Patent: Jan. 4, 2022

(54) DISPLAY DEVICE

(71) Applicant: Samsung Display Co., Ltd., Yongin-si (KR)

(72) Inventor: Seung Rok Lee, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 20 days.

(21) Appl. No.: 16/267,284

(22) Filed: Feb. 4, 2019

(65) Prior Publication Data

US 2019/0252470 A1 Aug. 15, 2019

(30) Foreign Application Priority Data

Feb. 5, 2018 (KR) .................. 10-2018-0014200

(51) Int. Cl.
*H01L 27/32* (2006.01)
*H01L 51/52* (2006.01)

(52) U.S. Cl.
CPC ........ *H01L 27/3211* (2013.01); *H01L 27/322* (2013.01); *H01L 27/3246* (2013.01); *H01L 51/5284* (2013.01)

(58) Field of Classification Search
CPC ... H01L 27/32; H01L 27/321; H01L 27/3211; H01L 27/322; H01L 27/324; H01L 27/3246; H01L 51/52; H01L 51/525; H01L 51/5253; H01L 51/5256; H01L 51/528; H01L 51/5284
USPC ........................................................ 257/40
See application file for complete search history.

(56) References Cited

U.S. PATENT DOCUMENTS

| 8,390,929 | B2 | 3/2013 | Hwang et al. | |
|---|---|---|---|---|
| 9,459,750 | B2 | 10/2016 | Han et al. | |
| 9,753,323 | B2 | 9/2017 | Kimura et al. | |
| 10,163,986 | B2* | 12/2018 | Fukagawa | H01L 51/5271 |
| 10,770,515 | B2* | 9/2020 | Kim | H01L 27/322 |
| 2014/0035456 | A1* | 2/2014 | Isa | H01L 51/5253 |
| | | | | 313/498 |
| 2015/0221710 | A1* | 8/2015 | Motoyama | H01L 27/3272 |
| | | | | 257/89 |
| 2016/0365397 | A1* | 12/2016 | Seo | H01L 27/322 |
| 2016/0378224 | A1 | 12/2016 | Kwon et al. | |
| 2017/0146855 | A1 | 5/2017 | Park et al. | |
| 2019/0013363 | A1* | 1/2019 | Joo | H01L 27/3211 |
| 2019/0206945 | A1* | 7/2019 | Lin | H01L 51/5284 |

FOREIGN PATENT DOCUMENTS

| JP | 5741879 B2 | 7/2015 |
|---|---|---|
| KR | 10-1056438 B1 | 8/2011 |
| KR | 10-2016-0029268 A | 3/2016 |
| KR | 10-2016-0081704 A | 7/2016 |
| KR | 10-2017-0059027 A | 5/2017 |
| KR | 10-2017-0083687 A | 7/2017 |

* cited by examiner

*Primary Examiner* — Monica D Harrison
(74) *Attorney, Agent, or Firm* — Lewis Roca Rothgerber Christie LLP

(57) ABSTRACT

A display device according to an embodiment of the present disclosure includes: a first pixel and a second pixel successively arranged along a first direction and configured to emit light of different colors, a first color filter disposed on the first pixel, and a second color filter disposed on the second pixel so as to be adjacent to the first color filter. The second color filter is expanded in a direction toward the first pixel at a boundary between the first pixel and the second pixel.

18 Claims, 8 Drawing Sheets

DISPLAY DEVICE

CROSS-REFERENCE TO RELATED APPLICATION

This application claims priority to and the benefit of Korean patent application 10-2018-0014200, filed on Feb. 5, 2018 in the Korean Intellectual Property Office, the entire disclosure of which is incorporated herein by reference.

BACKGROUND

1. Field

An aspect of the present disclosure relates to a display device.

2. Related Art

A display device includes a display panel having a plurality of pixels. Further, the display device may include various optical filters disposed on the display panel to ensure image quality characteristics. For example, a color filter, a polarizer, and a black matrix may be attached on the display panel. However, when the color filter, the polarizer, and the black matrix are separately prepared and disposed on the display panel, there is a limit in how much the thickness of the display device can be reduced. In addition, in a display device with a display panel including pixels, a phenomenon that a pattern of a specific color is unintentionally seen in a boundary region of the pixels may occur due to irregular (diffuse) reflection occurring in the display panel.

SUMMARY

Aspects of embodiments are directed toward a display device capable of improving image quality and reducing thickness.

According to an embodiment of the present disclosure, there is provided a display device including: a first pixel and a second pixel successively arranged along a first direction and configured to emit light of different colors, a first color filter disposed on the first pixel, and a second color filter disposed on the second pixel so as to be adjacent to the first color filter. The second color filter is expanded in a direction toward the first pixel at a boundary between the first pixel and the second pixel.

According to an embodiment, the second color filter may have a greater width than the first color filter in the first direction.

According to an embodiment, the first pixel may be a green pixel that emits green light, and the second pixel may be a red or blue pixel that emits red or blue light.

According to an embodiment, the second pixel may be arranged in a northwestern direction of the first pixel.

According to an embodiment, the second color filter may be arranged on a path along which light travels in a direction from the first pixel toward the second pixel within an azimuth range of 300° to 330°.

According to an embodiment, the display device may further include a display panel having a plurality of pixels including the first pixel and the second pixel. The display panel may include a thin film encapsulation layer covering the pixels, a color filter layer disposed on the thin film encapsulation layer, the color filter layer including the first color filter and the second color filter, and a black matrix disposed between the thin film encapsulation layer and the color filter layer, the black matrix having a plurality of openings exposing at least respective light emitting regions of the pixels.

According to an embodiment, each of the openings in the black matrix may be wider than a corresponding one of the light emitting regions in a region corresponding to a corresponding one of the pixels so as to ensure a viewing angle of a set or predetermined range.

According to an embodiment, a region of the black matrix may be disposed between a light emitting region of the first pixel and a light emitting region of the second pixel, and a boundary line between the first and second color filters may be at a position shifted from one end of the region of the black matrix adjacent to the light emitting region of the first pixel toward the second pixel by a distance corresponding to a difference between a thickness of the first color filter and a thickness of the black matrix.

According to an embodiment, each of the pixels may include a light emitting element including a first electrode, a light emitting layer and a second electrode sequentially disposed (arranged) in a corresponding one of the light emitting regions, and the display panel may further include a pixel defining layer disposed between the respective light emitting regions of the pixels and having openings each exposing the first electrode in a corresponding one of the respective light emitting regions.

According to an embodiment, the black matrix may be disposed on the pixel defining layer, and an opening of the black matrix may overlap an opening of the pixel defining layer and have an area greater than that of the opening of the pixel defining layer.

According to an embodiment, the display panel may further include a third pixel disposed next to (e.g., adjacent to) the second pixel in the first direction, and a third color filter disposed on the third pixel.

According to an embodiment, a boundary line between the second color filter and the third color filter may be at a central point of the black matrix disposed between light emitting regions of the second and third pixels.

According to an embodiment, the second color filter may have an asymmetric structure in which a width of the second color filter in a first pixel direction (e.g., the direction pointing toward the first pixel) is greater than a width thereof in a third pixel direction (e.g., the direction pointing toward the third pixel) with respect to a center of the light emitting region of the second pixel.

According to an embodiment, the third pixel may be configured to emit light of the same color as the first pixel.

According to an embodiment, the display device may further include a sensor electrode disposed between the thin film encapsulation layer and the black matrix.

BRIEF DESCRIPTION OF THE DRAWINGS

Example embodiments will now be described more fully hereinafter with reference to the accompanying drawings; however, they may be embodied in different suitable forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

Figure 1:
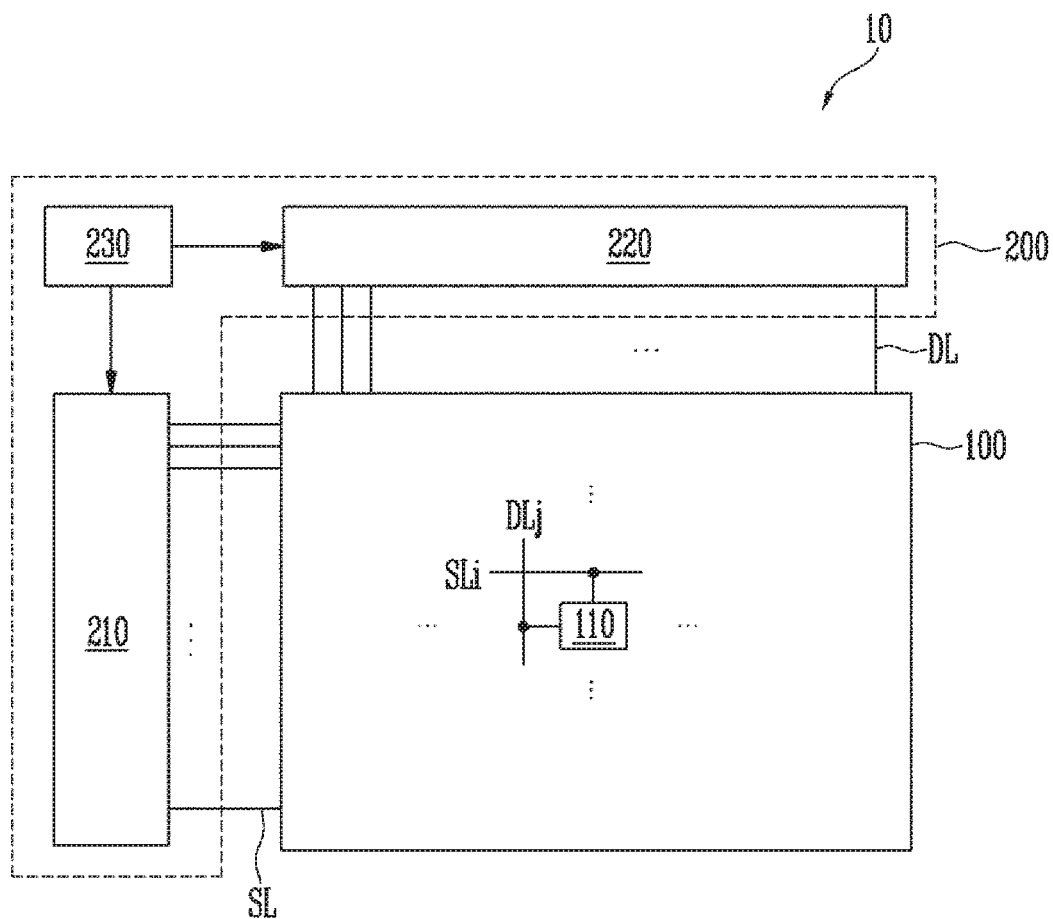
FIG. 1 illustrates a display device according to an embodiment of the present disclosure.

Hereinafter, embodiments of the present disclosure will be described in detail with reference to the accompanying drawings. However, the present disclosure is not limited to the embodiments but may be implemented into different forms. These embodiments are provided only for illustrative purposes and for full understanding of the scope of the present disclosure by those skilled in the art. In the entire specification, when an element is referred to as being "connected" or "coupled" to another element, it can be directly connected or coupled to the other element or be indirectly connected or coupled to the other element with one or more intervening elements interposed therebetween.

In the following embodiments and the attached drawings, elements not directly related to the present disclosure may be omitted from depiction, and dimensional relationships among individual elements in the attached drawings may be illustrated only for ease of understanding but not to limit the actual scale. It should be noted that in giving reference numerals to elements of each drawing, like reference numerals may refer to like elements even though like elements are shown in different drawings.

FIG. 1 illustrates a display device 10 according to an embodiment of the present disclosure.

Referring to FIG. 1, the display device 10 according to the embodiment includes a display panel 100 and a panel driver 200. In FIG. 1, the display panel 100 and the panel driver 200 are shown separated from each other, but the present disclosure is not limited thereto. For example, in an embodiment, the panel driver 200 may be located outside the display panel 100 and electrically connected to the display panel 100. Alternately, in another embodiment, at least a part of the panel driver 200 may be manufactured integrally with the display panel 100 or may be mounted on the display panel 100.

The display panel 100 includes a plurality of scan lines SL, a plurality of data lines DL and a plurality of pixels 110 coupled to the scan lines SL and the data lines DL. The pixels 110 may be disposed in an active area of the display panel 100, for example, a display area where an image is displayed. Each of the pixels 110 may be coupled to at least one scan line SL and at least one data line DL and emit light in response to a scan signal and a data signal supplied through the corresponding scan line SL and the corresponding data line DL.

For example, the pixel 110 on an ith (i is a natural number) row and a jth (j is a natural number) column of the display panel 100 may be coupled to an ith scan line SLi and a jth data line DLj. The pixel 110 receives a data signal of a corresponding frame from the jth data line DLj when a scan signal of a gate-on voltage is supplied to the ith scan line SLi and may emit light with a luminance corresponding to the data signal during each frame period. When a data signal corresponding to a black level of a gray scale is supplied during a frame period, the pixel 110 may maintain a non-emission state during the corresponding frame period.

The panel driver 200 includes a scan driver 210 for driving the scan lines SL, a data driver 220 for driving the data lines DL, and a timing controller 230 for driving the scan driver 210 and the data driver 220.

The scan driver 210 supplies a scan signal to the scan lines SL in response to a scan control signal supplied from the timing controller 230. For example, the scan driver 210 may receive a scan start signal and at least one clock signal from the timing controller 230 and sequentially output each scan signal to the scan lines SL. In another embodiment, the scan driver 210 may output each scan signal to the scan lines SL corresponding to a set or predetermined scan sequence. The scan signal may be set to have the gate-on voltage (e.g., a low voltage) so that transistors included in each of the pixels 110 are turned on.

The data driver 220 generates a data signal using a video data (e.g., the video data rearranged in the timing controller 230) and a data control signal from the timing controller 230. The data signal generated in the data driver 220 may be output to the data lines DL in each horizontal period constituting one frame period to be synchronized with a corresponding scan signal.

The timing controller 230 receives a video data and a display control signal from a host processor or the like and drives the scan driver 210 and the data driver 220 accordingly. The display control signal may include various timing signals, such as a vertical synchronization signal, a horizontal synchronization signal, a data enable signal, and/or a clock signal.

For example, the timing controller 230 may rearrange a video data of each frame and supply the rearranged video data to the data driver 220. In addition, the timing controller 230 may generate the scan control signal and the data control signal in response to the display control signal and supply the scan control signal and the data control signal to the scan driver 210 and the data driver 220, respectively. In this manner, the timing controller 230 may control the scan driver 210 and the data driver 220.

Figure 2:
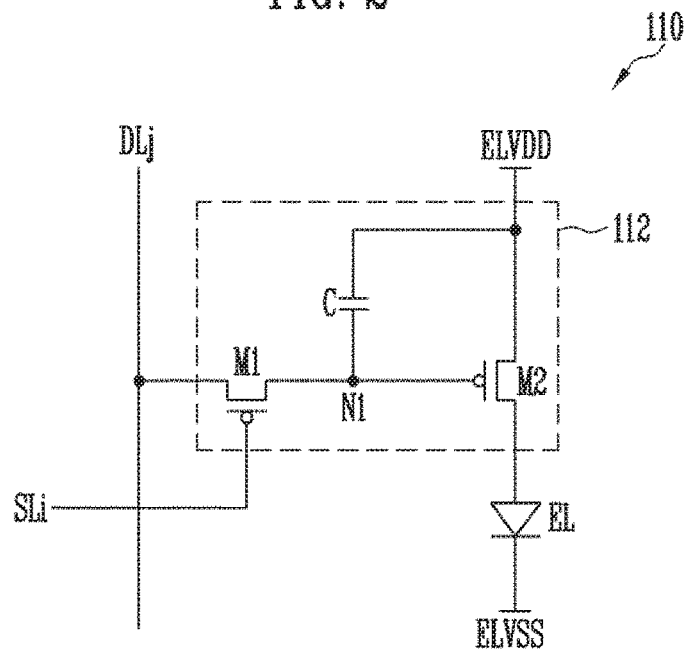
FIG. 2 illustrates a pixel according to an embodiment of the present disclosure.

FIG. 2 illustrates a pixel according to an embodiment of the present disclosure. For example, FIG. 2 shows an arbitrary pixel included in the display panel 100 of FIG. 1, for example, the pixel 110 coupled to the ith scan line SLi and the jth data line DLj. However, the structure of the pixel 110 is not limited to the embodiment shown in FIG. 2. That is, the pixel 110 may have various suitable structures. In addition, an example of the pixel 110 is shown in FIG. 2 on the assumption that the display panel 100 is an organic light emitting display panel. However, the present disclosure is not limited thereto. That is, the type and/or structure of the display panel 100 and the pixel 110 are not particularly limited and may be modified in various suitable forms.

Referring to FIG. 2, the pixel 110 according to the embodiment may include a light emitting element EL coupled between a first power supply ELVDD and a second power supply ELVSS, and a pixel circuit 112 for controlling a current flowing through the light emitting element EL. The pixel circuit 112 may be coupled between the first power supply ELVDD and the light emitting element EL, and further coupled to the corresponding scan line SLi and the corresponding data line DLj. However, the position of the pixel circuit 112 is not limited thereto. For example, the pixel circuit 112 may be coupled between the light emitting element EL and the second power supply ELVSS.

The first power supply ELVDD and the second power supply ELVSS have different potentials. For example, the first power supply ELVDD may be set to a high potential power supply and the second power supply ELVSS may be set to a low potential power supply. The potential difference between the first power supply ELVDD and the second power supply ELVSS, i.e., a voltage applied between the first power supply ELVDD and the second power supply ELVSS may be greater than a threshold voltage of the light emitting element EL.

The light emitting element EL is coupled to the first power supply ELVDD via the pixel circuit 112. The light emitting element EL emits light at a luminance corresponding to a driving current supplied from the pixel circuit 112. According to an embodiment, the light emitting element EL may be, but is not limited to, an organic light emitting diode (OLED) including an organic light emitting layer.

The pixel circuit 112 may include first and second transistors M1 and M2 and a capacitor C.

The first transistor (switching transistor) M1 is coupled between the corresponding data line DLj and a first node N1. A gate electrode of the first transistor M1 is coupled to the corresponding scan line SLi. When a scan signal is supplied to the scan line SLi, the first transistor M1 is turned on and electrically connects the data line DLj and the first node N1. Accordingly, when the first transistor M1 is turned on, a data signal supplied to the data line DLj is transferred to the first node N1.

The second transistor (driving transistor) M2 is coupled between the first power supply ELVDD and the light emitting element EL. A gate electrode of the second transistor M2 is coupled to the first node N1. The second transistor M2 controls a driving current flowing to the light emitting element EL in response to a voltage of the first node N1. For example, the second transistor M2 may control the supply of and/or the magnitude of the driving current according to the voltage of the first node N1.

The capacitor C is coupled between the first power supply ELVDD and the first node N1. The capacitor C stores a voltage corresponding to the data signal and maintains the stored voltage until a data signal of the next frame is supplied.

Figure 3:
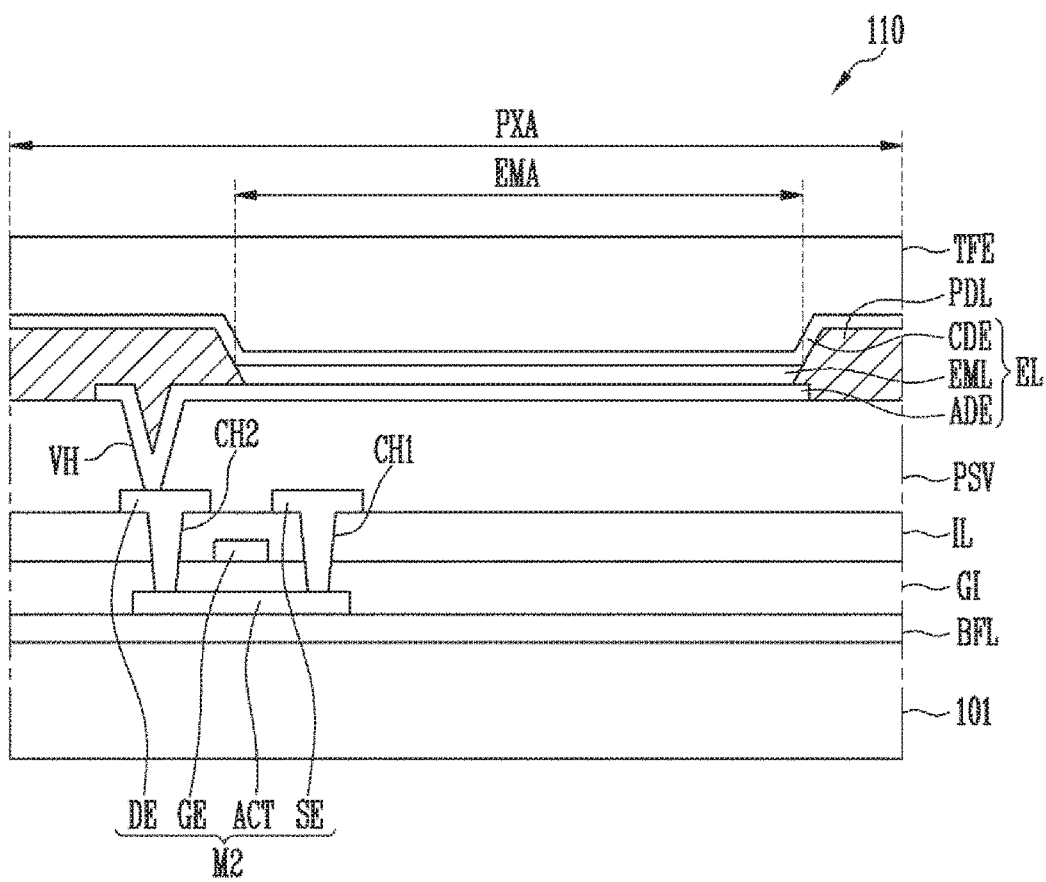
FIG. 3 illustrates an example of a cross-sectional structure of the pixel shown in FIG. 2.

FIG. 3 illustrates an example of a cross-sectional structure of the pixel shown in FIG. 2. For convenience, only a partial area of the pixel 110, (e.g., an area where the light emitting element EL and the second transistor M2 coupled to the light emitting element EL are disposed) is illustrated in FIG. 3. The first transistor M1 which is not shown in FIG. 3 may have substantially the same or similar cross-sectional structure to the second transistor M2. At least one of the electrodes constituting the capacitor C may be disposed on the same layer as at least one electrode constituting the first and second transistors M1 and M2.

Referring to FIG. 3, each pixel 110 may be formed on a surface of a base substrate 101 serving as a base plate of the display panel 100. For example, each pixel 110 may be formed on each pixel region PXA of the base substrate 101.

The base substrate 101 may be a rigid or flexible substrate, and the material thereof is not particularly limited. For example, the base substrate 101 may be a thin film substrate having flexibility.

According to an embodiment, a buffer layer BFL may be formed on the surface of the base substrate 101. The buffer layer BFL may prevent or reduce impurities from being diffused from the base substrate 101 and improve the flatness of the base substrate 101. The buffer layer BFL may be provided in a single layer, but may also be provided in a multi-layer including at least two layers. The buffer layer BFL may be an inorganic insulating layer made of an inorganic material. For example, the buffer layer BFL may be formed of silicon nitride, silicon oxide, silicon oxynitride, or the like. When the buffer layer BFL is provided in a multi-layer, layers may be formed of the same material or different materials. In another embodiment, the buffer layer BFL may be omitted.

Various circuit elements constituting the pixel circuit 112 including the second transistor M2 are formed on the buffer layer BFL. In addition, wiring lines including at least one power supply line and/or various signal lines may be formed together with the circuit elements in a process or processes of forming the circuit elements. For example, at least one power supply line for supplying first and/or second powers from the first and/or second power supplies ELVDD and/or ELVSS may be formed together with the scan lines SL and the data lines DL in the processing task of forming the circuit elements of the pixel circuit 112.

The second transistor M2 includes an active layer ACT, a gate electrode GE, a source electrode SE, and a drain electrode DE. According to an embodiment, the active layer ACT may be disposed on the buffer layer BFL, and be formed of a semiconductor material. For example, the active layer ACT may be a semiconductor pattern made of polysilicon, amorphous silicon, oxide semiconductor, or the like, and be formed of a semiconductor layer undoped or doped with an impurity. Alternatively, one region of the active layer ACT is undoped with the impurity, and the other region of the active layer ACT may be doped with the impurity.

A gate insulating layer GI may be formed on the active layer ACT, and the gate electrode GE may be formed on the gate insulating layer GI. According to an embodiment, the scan lines SL may be formed together with the gate electrode GE in the task of forming the gate electrode GE.

An interlayer insulating layer IL may be formed on the gate electrode GE, and the source electrode SE and the drain electrode DE may be formed on the interlayer insulating layer IL. The source electrode SE and the drain electrode DE may be connected to different regions of the active layer ACT through a first contact hole and a second contact hole penetrating the gate insulating layer GI and the interlayer insulating layer IL, respectively.

A passivation layer PSV (or a planarizing layer) may be formed on the source electrode SE and the drain electrode DE. The passivation layer PSV may cover the pixel circuit 112 including the second transistor M2 and planarize a top surface of the pixel circuit 112.

The light emitting element EL is formed on the passivation layer PSV. The light emitting element EL may include a first electrode ADE, an emitting layer EML, and a second electrode CDE sequentially disposed on a light emitting region EMA of the corresponding pixel 110.

The first electrode ADE of the light emitting element EL may be disposed on the passivation layer PSV and connected to one electrode of the second transistor M2, e.g., the drain electrode DE, through a via hole VH (or a third contact hole)

penetrating the passivation layer PSV. According to an embodiment, the first electrode ADE may be an anode electrode of the light emitting element EL, but is not limited thereto.

A pixel defining layer PDL that defines each pixel region PXA, in particular, the light emitting region EMA of each pixel 110, is formed on one surface of the base substrate 101 on which the first electrode ADE, and the like are formed. The pixel defining layer PDL is disposed between the light emitting regions EMA of the pixels 110 and has an opening exposing the first electrode ADE in each light emitting region EMA. For example, the pixel defining layer PDL may protrude upward from the base substrate 101, on which the first electrode ADE or the like is formed, along the circumference of the light emitting regions EMA.

The light emitting layer EML is formed in each light emitting region EMA surrounded by the pixel defining layer PDL. For example, the light emitting layer EML may be disposed on the exposed surface of the first electrode ADE. According to an embodiment, the light emitting layer EML may have a multi-layered thin film structure including at least a light generation layer. For example, the light emitting layer EML may include a hole injection layer, a hole transport layer, the light generation layer, a hole blocking layer, an electron transport layer, and an electron injection layer. According to an embodiment, the color of light generated from the light emitting layer EML may be one of red, green, blue, and white, but is not limited thereto.

The second electrode CDE of the light emitting element EL is formed on the light emitting layer EML. According to an embodiment, the second electrode CDE may be a cathode electrode, but is not limited thereto. In addition, the second electrodes CDE in the respective pixel regions EMA may be integrally connected to each other, but are not limited thereto.

A thin film encapsulation layer TFE covering the second electrode CDE of the light emitting element EL is formed on the second electrode CDE. The thin film encapsulation layer TFE may cover the pixels 110 so as to seal a region of the display panel 100, e.g., at least an active area, where the pixels 110 are disposed. When the active area is sealed using the thin film encapsulation layer TFE, the thickness of the display panel 100 may be reduced and flexibility of the display panel 100 may be ensured.

According to an embodiment, the thin film encapsulation layer TFE may be of a multi-layered or single-layered structure. For example, the thin film encapsulation layer TFE may include at least two inorganic layers overlapping each other and at least one organic layer interposed between the inorganic layers. Alternatively, in another embodiment, the thin film encapsulation layer TFE may be formed as a single organic/inorganic hybrid insulating film.

Figure 4:
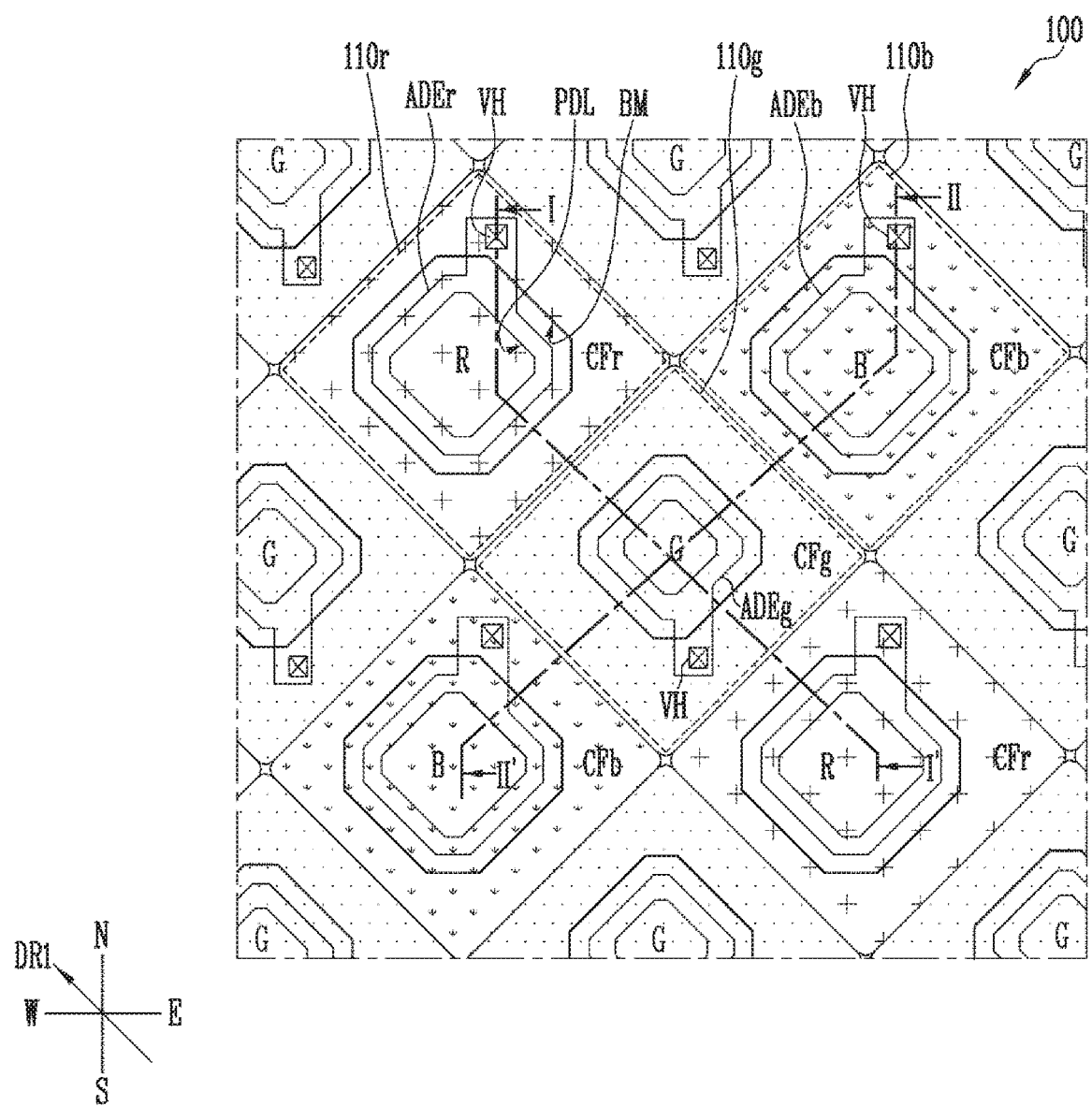
FIG. 4 illustrates a partial area of a display panel according to an embodiment of the present disclosure.
Figure 5:
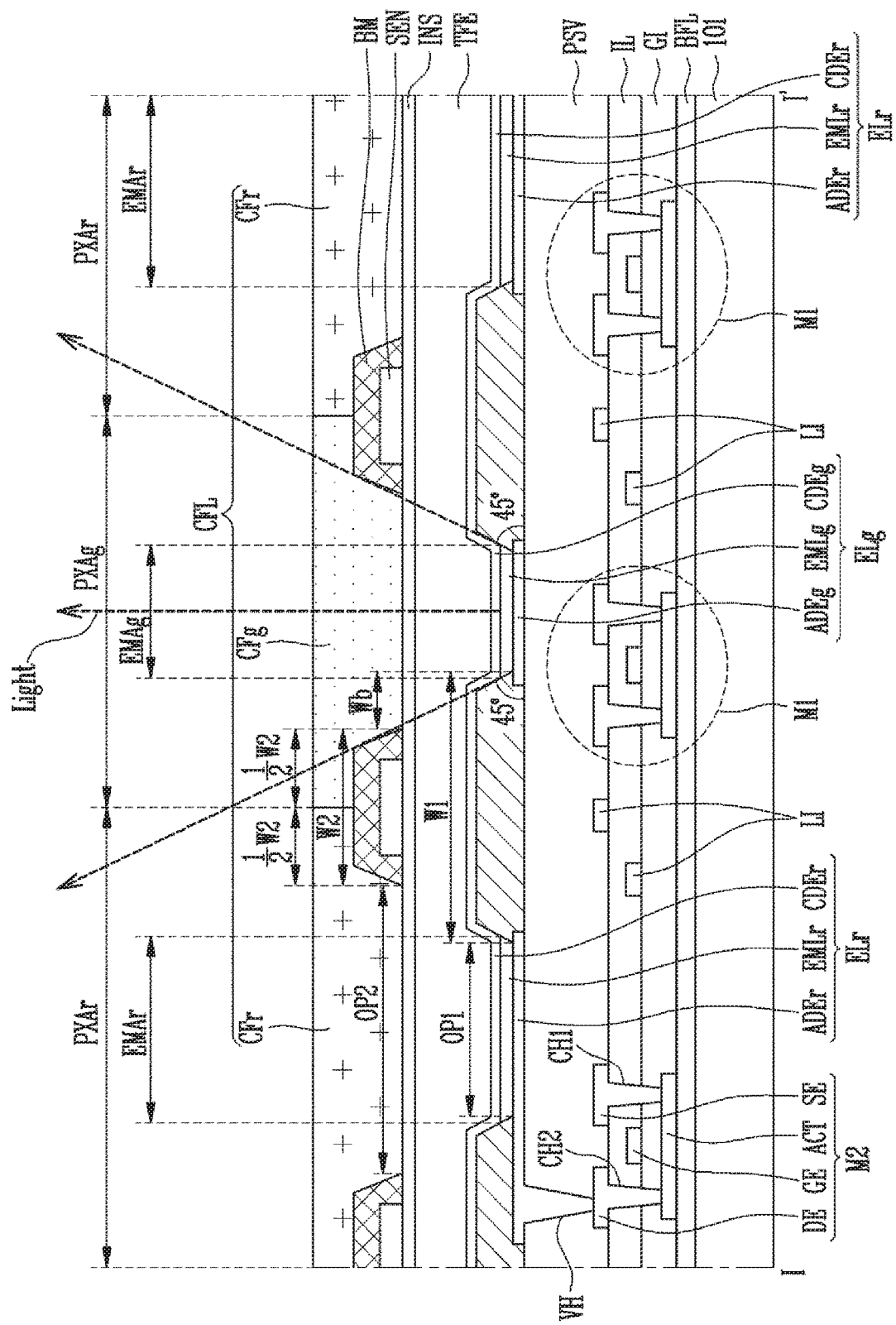
FIG. 5 illustrates an example of a cross section taken along line I-I' of FIG. 4.
Figure 6:
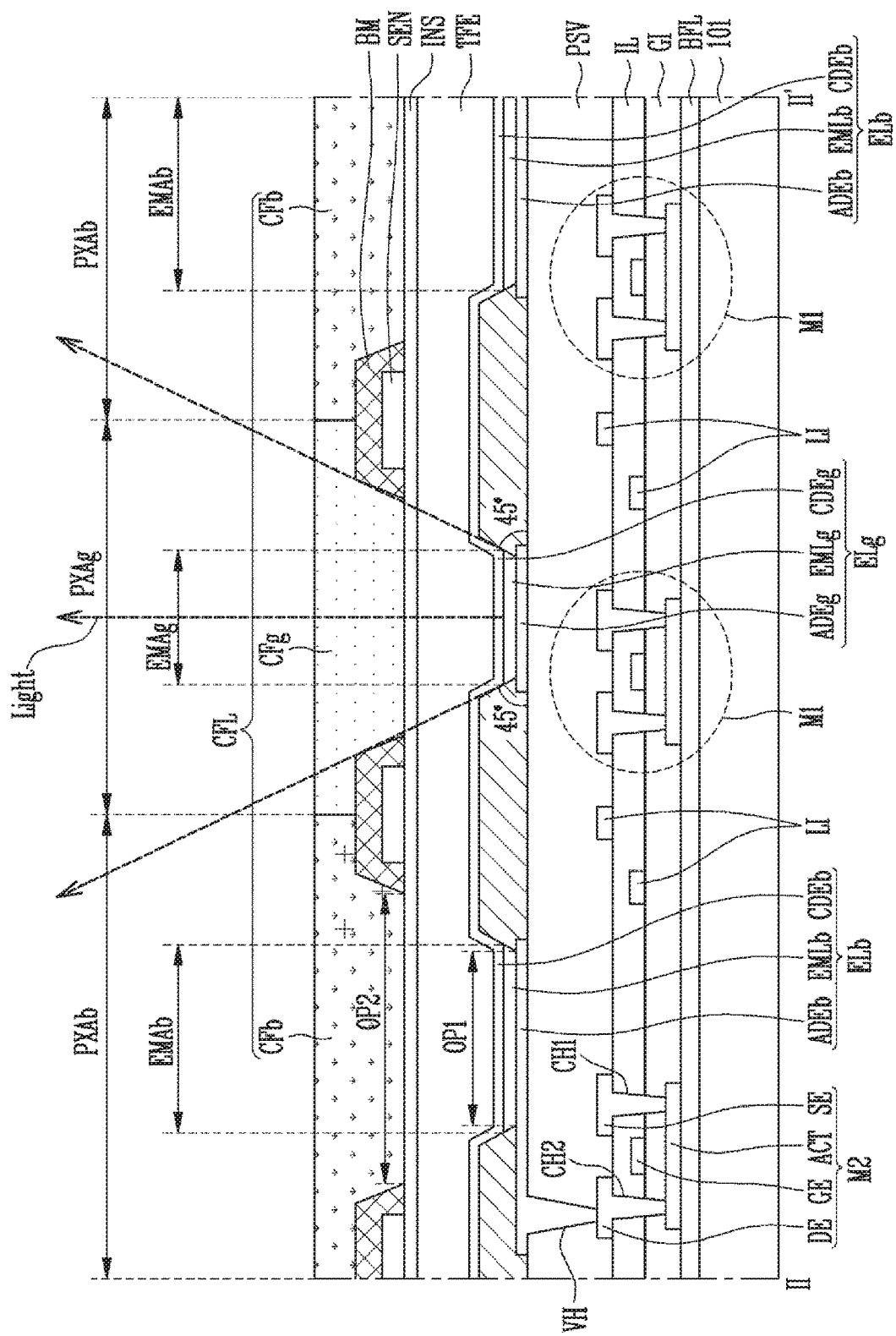
FIG. 6 illustrates an example of a cross section taken along line II-II' of FIG. 4.

FIG. 4 illustrates a partial area of a display panel according to an embodiment of the present disclosure. In particular, FIG. 4 is a plan view schematically showing an arrangement structure of respective color pixels. FIG. 5 illustrates an example of a cross section taken along line I-I' of FIG. 4, and FIG. 6 illustrates an example of a cross section taken along line II-II' of FIG. 4. In FIGS. 5 and 6, 'PXAr', 'PXAg' and 'PXAb' represent pixel regions of red, green and blue pixels, respectively, and 'EMAr', 'EMAg' and 'EMAb' represent light emitting regions of the red, green and blue pixels, respectively.

Referring to the FIGS. 4 to 6, the display panel 100 of the present disclosure includes a plurality of pixels 110r, 110g, and 110b that emit light of different colors. For example, the display panel 100 may include a plurality of red pixels 110r emitting red light, a plurality of green pixels 110g emitting green light, and a plurality of blue pixels 110b emitting blue light. According to an embodiment, the red, green, and blue pixels 110r, 110g, and 110b may be arranged in a pen-tile matrix form, but are not limited thereto.

Each red pixel 110r includes at least one red light emitting element ELr that emits red light. The red light emitting element ELr may include first and second electrodes ADEr and CDEr and a red light emitting layer EMLr interposed between the first and second electrodes ADEr and CDEr. According to an embodiment, the second electrode CDEr of the red light emitting element ELr may be integrally connected to the second electrode CDEg and CDEb of the green and blue light emitting elements ELg and ELb.

According to an embodiment, the red pixel 110r may further include at least one circuit element for driving the red light emitting element ELr. For example, the red pixel 110r may include the pixel circuit 112 including the first and second transistors M1 and M2 and the capacitor C as shown in FIG. 2. However, in FIG. 5, only the first and second transistors M1 and M2 among the circuit elements constituting the pixel circuit 112 of the red pixel 110r are shown for convenience.

Each green pixel 110g includes at least one green light emitting element ELg that emits green light. The green light emitting element ELg may include first and second electrodes ADEg and CDEg and a green light emitting layer EMLg interposed between the first and second electrodes ADEg and CDEg.

According to an embodiment, the green pixel 110g may further include at least one circuit element for driving the green light emitting element ELg. For example, the green pixel 110g may include the pixel circuit 112 including the first and second transistors M1 and M2 and the capacitor C as shown in FIG. 2. However, in FIG. 5, only the first transistor M1, among the circuit elements constituting the pixel circuit 112 of the green pixel 110g, is shown for convenience.

Each blue pixel 110b includes at least one blue light emitting element ELb that emits blue light. The blue light emitting element ELb may include first and second electrodes ADEb and CDEb and a blue light emitting layer EMLb interposed between the first and second electrodes ADEb and CDEb.

According to an embodiment, the blue pixel 110b may further include at least one circuit element for driving the blue light emitting element ELb. For example, the blue pixel 110b may include the pixel circuit 112 including the first and second transistors M1 and M2 and the capacitor C as shown in FIG. 2. However, in FIG. 6, only the first and second transistors M1 and M2, among the circuit elements constituting the pixel circuit 112 of the blue pixel 110b, are shown for convenience.

A plurality of wiring lines LI may be formed along with the pixel circuits 112 of the red, green, and blue pixels 110r, 110g, and 110b on a circuit layer on which the pixel circuits 112 are formed. For example, at least one power supply line for supplying the first and/or second powers from the first and/or second power supplies ELVDD and/or ELVSS, the scan lines SL and the data lines DL may be further formed on the circuit layer.

According to an embodiment, the display panel 100 may include a color filter layer CFL formed integrally with the display panel 100. In addition, the display panel 100 may further include a black matrix BM and/or sensor electrodes SEN (e.g., sensor electrodes constituting a touch sensor) formed integrally with the display panel 100.

For example, the display panel 100 according to the embodiment of the present disclosure may be an optical filter integrated display panel integrally having the color filter layer CFL and the black matrix BM. It is possible to provide a desired polarization characteristic through the combination of the color filter layer CFL and the black matrix BM. That is, the color filter layer CFL and the black matrix BM may function as a polarizer, so that excellent image quality characteristics may be ensured without providing a separate polarizing plate.

In addition, the display panel 100 may be a sensor integrated display panel integrally having at least one sensor electrode SEN, for example, a plurality of sensor electrodes SEN. According to an embodiment, the sensor electrodes SEN may be touch electrodes for detecting a touch input, so that a touch sensor may be formed by the sensor electrodes SEN. For example, the sensor electrodes SEN may be provided to form a capacitive touch sensor, and may be formed of touch electrodes having various structures currently known. In the present disclosure, the types of the sensor electrodes SEN are not limited to the electrodes for forming the touch sensor, and the sensor electrodes SEN may be electrodes for forming various sensors. For example, the sensor electrodes SEN may be provided to form a pressure sensor.

According to an embodiment, the color filter layer CFL, the black matrix BM and the sensor electrodes SEN are directly formed on one surface of the base substrate 101 on which the thin film encapsulation layer TFE is formed. In addition, at least one insulating layer INS may be disposed between the color filter layer CFL, the black matrix BM, the sensor electrodes SEN and the thin film encapsulation layer TFE. However, the insulating layer INS may be omitted in another embodiment.

For example, the insulating layer INS may be formed on the thin film encapsulation layer TFE, and the sensor electrodes SEN may be formed on the insulating layer INS. According to an embodiment, the sensor electrodes SEN may be disposed on the pixel defining layer PDL so as to be disposed between the light emitting regions EMAr, EMAg, and EMAb, but the position of the sensor electrodes SEN is not limited thereto.

When the sensor electrodes SEN are directly formed on the top of the thin film encapsulation layer TFE (or the top of the insulating layer INS formed on the thin film encapsulation layer TFE), a separate substrate for forming a touch sensor, or the like, may be omitted. Accordingly, it is possible to reduce the thickness of the display device 10 including a sensor.

The black matrix BM is formed on one surface of the base substrate 101 on which the thin film encapsulation layer TFE and/or the sensor electrodes SEN is formed. The black matrix BM may be disposed on the pixel defining layer PDL so as to be disposed between the light emitting regions EMAr, EMAg and EMAb. For example, the black matrix BM may be disposed in a non-emission region on the pixel defining layer PDL so as to cover the sensor electrodes SEN.

The black matrix BM may have at least one opening, for example, a plurality of openings respectively disposed in regions corresponding to the pixels 110r, 110g and 110b. Each of the openings has an area greater than that of a corresponding one of the light emitting regions EMAr, EMAg, and EMAb of each of the pixels 110r, 110g and 110b, around the corresponding one of the light emitting regions EMAr, EMAg, and EMAb, so as to ensure a viewing angle of a set or predetermined range. For example, the black matrix BM may have a plurality of second openings OP2 overlapping the respective light emitting regions EMAr, EMAg, and EMAb and each having an area greater than that of the corresponding one of the light emitting regions EMAr, EMAg, and EMAb, so as to ensure a viewing angle of at least 45° within a set or predetermined error range (or a tolerance).

That is, each second opening OP2 may overlap a corresponding first opening OP1 formed in the pixel defining layer PDL in a corresponding pixel region PXAr, PXAg or PXAb and may have an area greater than that of the corresponding first opening OP1. For example, each second opening OP2 may have an area greater than that of the corresponding first opening OP1 so as to ensure a viewing angle of about 45° around a corresponding light emitting region EMAr, EMAg, or EMAb. Each of the second openings OP2 may expose a corresponding one of the light emitting regions EMAr, EMAg and EMA and its peripheral region.

According to an embodiment, when the line width (or a critical dimension (CD)) of the pixel defining layer PDL is W1 and the line width of the black matrix BM is W2, W1 and W2 may satisfy the following Equation 1.

$$W2 = W1 - (2*Wb) \quad \text{[Equation 1]}$$

In Equation 1, Wb denotes a one-sided bias value between the pixel defining layer PDL and the black matrix BM, which is a one-sided bias value set so as to ensure a viewing angle of a set or predetermined range (e.g., a viewing angle of at least 45°).

The color filter layer CFL is formed on one surface of the base substrate 101 on which the thin film encapsulation layer TFE and the black matrix BM are formed. According to an embodiment, the color filter layer CFL may include a red color filter CFr, a green color filter CFg, and a blue color filter CFb.

The red color filter CFr is disposed on the red pixel 110r. For example, the red color filter CFr may be disposed on the red pixel 110r so as to overlap at least the light emitting region EMAr of the red pixel 110r. The red color filter CFr may further overlap the peripheral region of the red pixel 110r along with the red pixel 110r with a margin (or a tolerance) of a set or predetermined range. For example, the red color filter CFr may be disposed so as to cover the red pixel region PXAr and be in contact with the neighboring green color filter CFg. For example, the boundary line between the red color filter CFr and the green color filter CFg may be located at a central point of the black matrix BM disposed at the corresponding position.

The green color filter CFg is disposed on the green pixel 110g. For example, the green color filter CFg may be disposed on the green pixel 110g so as to overlap at least the light emitting region EMAg of the green pixel 110g. The green color filter CFg may further overlap the peripheral region of the green pixel 110g along with the green pixel 110g with a margin of a set or predetermined range. For example, the green color filter CFg may be disposed so as to cover the green pixel region PXAg and be in contact with the red and blue color filters CFr and CFb adjacent thereto. For example, the boundary line between the green color filter CFg and the red and blue color filters CFr and CFb may be located at a central point of the black matrix BM disposed at the corresponding position.

The blue color filter CFb is disposed on the blue pixel 110b. For example, the blue color filter CFb may be disposed on the blue pixel 110b so as to overlap at least the light emitting region EMAb of the blue pixel 110b. The blue color filter CFb may further overlap the peripheral region of the blue pixel 110b along with the blue pixel 110b with a margin of a set or predetermined range. For example, the blue color filter CFb may be disposed so as to cover the blue pixel region PXAb and be in contact with the adjacent green color filter CFg. For example, the boundary line between the blue color filter CFb and the green color filter CFg may be located at a central point of the black matrix BM disposed at the corresponding position. Each of the color filters CFr, CFg, and CFb may overlap the black matrix BM by a width corresponding to half of the line width W2 of the black matrix BM, i.e., (½)*W2, at each end.

As described above, the display panel 100 according to the embodiment of the present disclosure may be integrated with an optical filter and/or a sensor. When the display panel 100 is formed with an optical filter and a sensor integrated display panel, the display device having the display panel 100 may exhibit excellent image quality characteristics and be formed with a smaller thickness while providing or supporting a sensor function. When the thickness of the display device is reduced in this manner, flexibility may be ensured.

However, in the display panel 100 according to the above-described embodiment, a phenomenon that a pattern caused by reflection light of a specific color (e.g., a striped pattern having specific reflection color) is undesirably seen in boundary regions of the pixels 110r, 110g, and 110c (hereinafter, "a reflection color pattern defect") may occur due to irregular (diffuse) reflection (or asymmetric reflection) occurring in each of the pixel regions PXAr, PXAg and PXAb. This visible defective pattern may be a striped pattern, or the like, but the shape of the defective pattern is not limited thereto. The reflection color pattern defect will be described in more detail with reference to FIG. 7.

Figure 7:
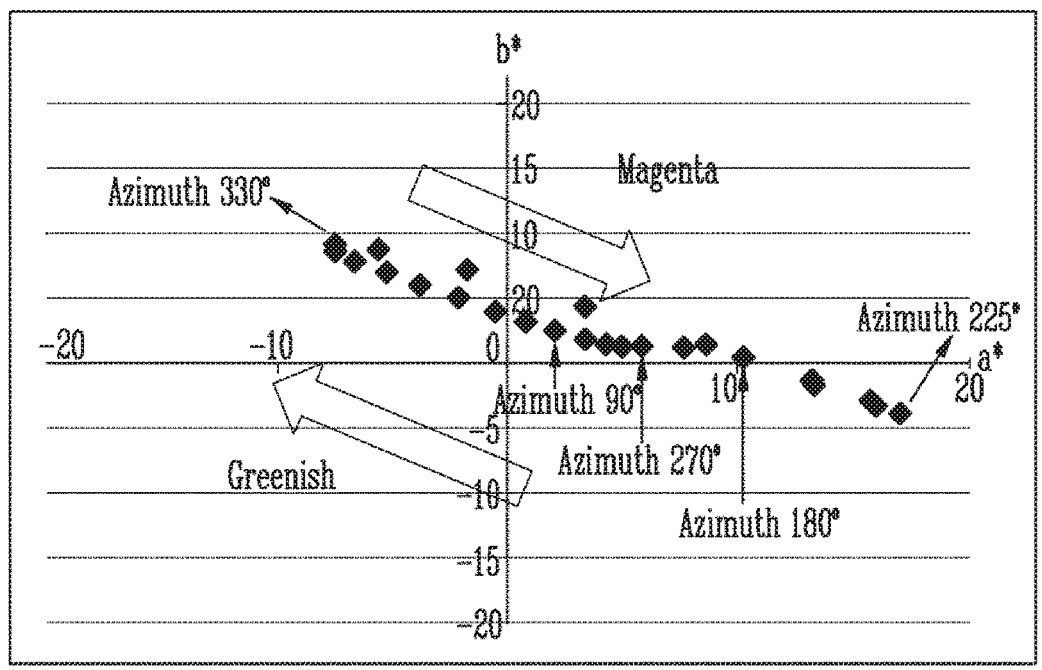
FIG. 7 is a graph for explaining a reflection color pattern defect occurring in the display panel shown in FIGS. 4 to 6 for showing, in particular, a reflection color according to respective reflection azimuth angles.

FIG. 7 is a graph for explaining a reflection color pattern defect occurring in the display panel shown in FIGS. 4 to 6. In particular, FIG. 7 shows a reflection color according to respective reflection azimuth angles. Hereinafter, the reflection color pattern defect will be described in more detail with reference to FIG. 7 in conjunction with FIGS. 4 to 6.

Referring to FIGS. 4 to 7, the circuit layer including the first and second transistors M1 and M2, and the wiring lines LI, and the like is formed under each of the light emitting elements ELr, ELg and ELb. The circuit layer is covered with a protective layer, e.g., the passivation layer PSV, whereby it is possible to obtain a certain degree of planarization effect. However, the upper surface of the protective layer PSV may still be finely uneven. For example, a fine task may be distributed on the upper surface of the protective layer PSV. That is, it is difficult for the upper surface of the protective layer PSV to be completely planarized due to the circuit elements thereunder. Therefore, a diffuse reflection component of external reflected light, e.g., a specular component excluded (SCE) component which is generated when external light incident on the display panel 100 is reflected by the display panel 100 may cause a visible reflection color pattern at a specific position.

For example, as shown in FIG. 7, a greenish reflection color pattern may appear in the direction of 11 o'clock, and the greenish reflection color pattern appears to be most noticeable within an azimuth range of 300° to 330°, particularly at the azimuth of 330°. For example, the reflected light (in particular, a green wavelength component of the reflected light) which is reflected by the green pixel 110g shown in FIG. 4 and transmitted through the green color filter CFg on the green pixel 110g may form or cause a greenish reflection color pattern (e.g., a striped greenish reflection color pattern) in the northwestern direction (a first direction DR1) of the green pixel 110g. A magenta colored reflection color pattern (e.g., a striped magenta colored reflection color pattern) may appear in the direction of 5 o'clock, and the magenta colored reflection color pattern appears to be most noticeable at the azimuth of 225°.

In FIG. 7, a* is a parameter representing a reflection color of red, which means that the larger the value is on the a* axis, the more reddish reflection color (or a reddish reflection color pattern) appears. In addition, b* is a parameter representing a reflection color of yellow, which means that the larger the value is on the b* axis, the more yellowish color (or a yellowish reflection color pattern) appears.

The reflection color pattern may be undesirably seen by the user, which may cause deterioration of the image quality of the display device 10. Particularly, because green is a color which is visually more strongly perceived by the user than the other colors under the same luminance condition, the greenish reflection color pattern may be a main factor of deterioration of the image quality. Accordingly, the present disclosure provides a structure of the display device 10 capable of mitigating or preventing the reflection color pattern defect, especially, the greenish reflection color pattern defect.

Figure 8:
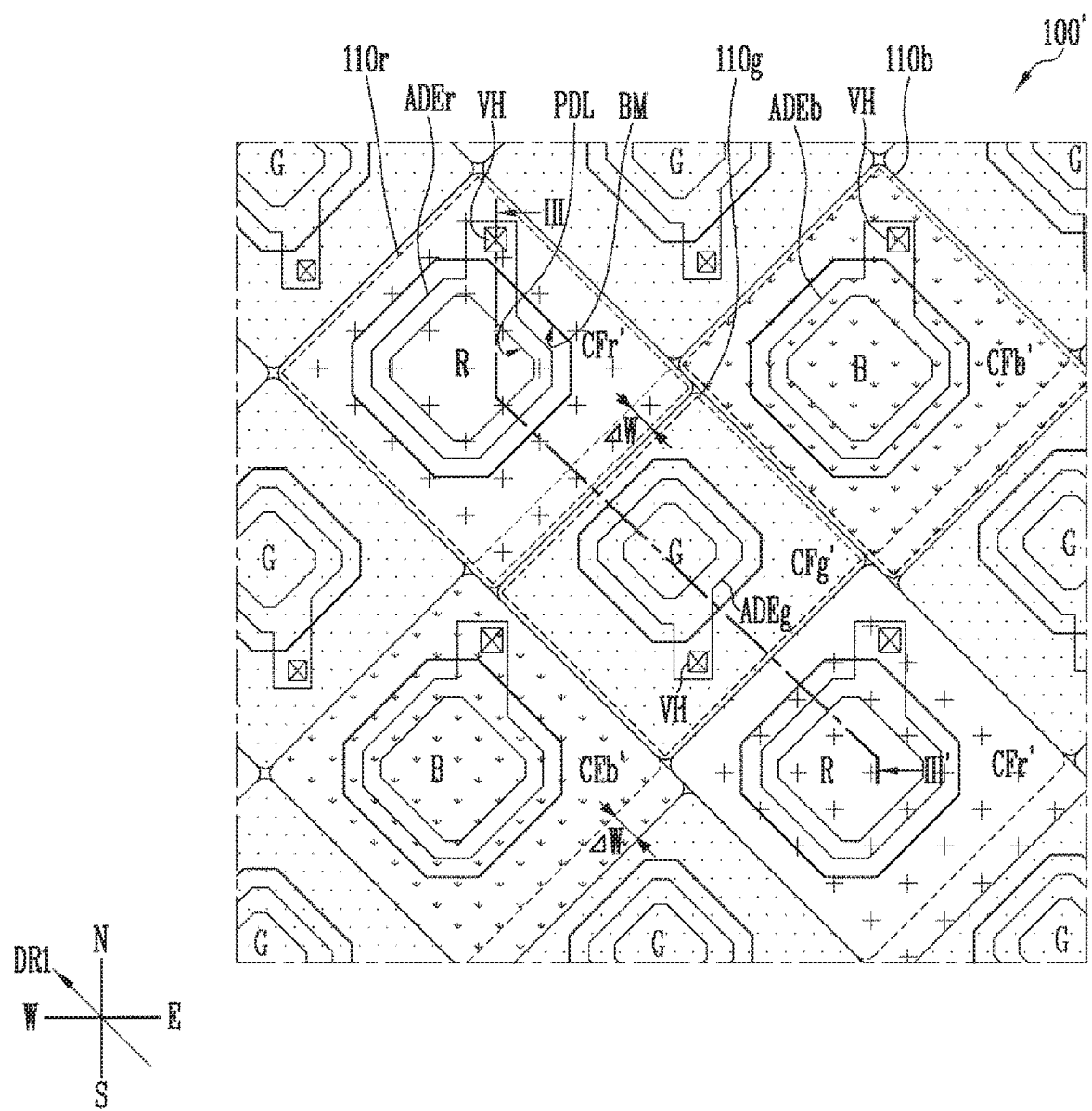
FIG. 8 illustrates a partial area of a display panel according to another embodiment of the present disclosure.
Figure 9:
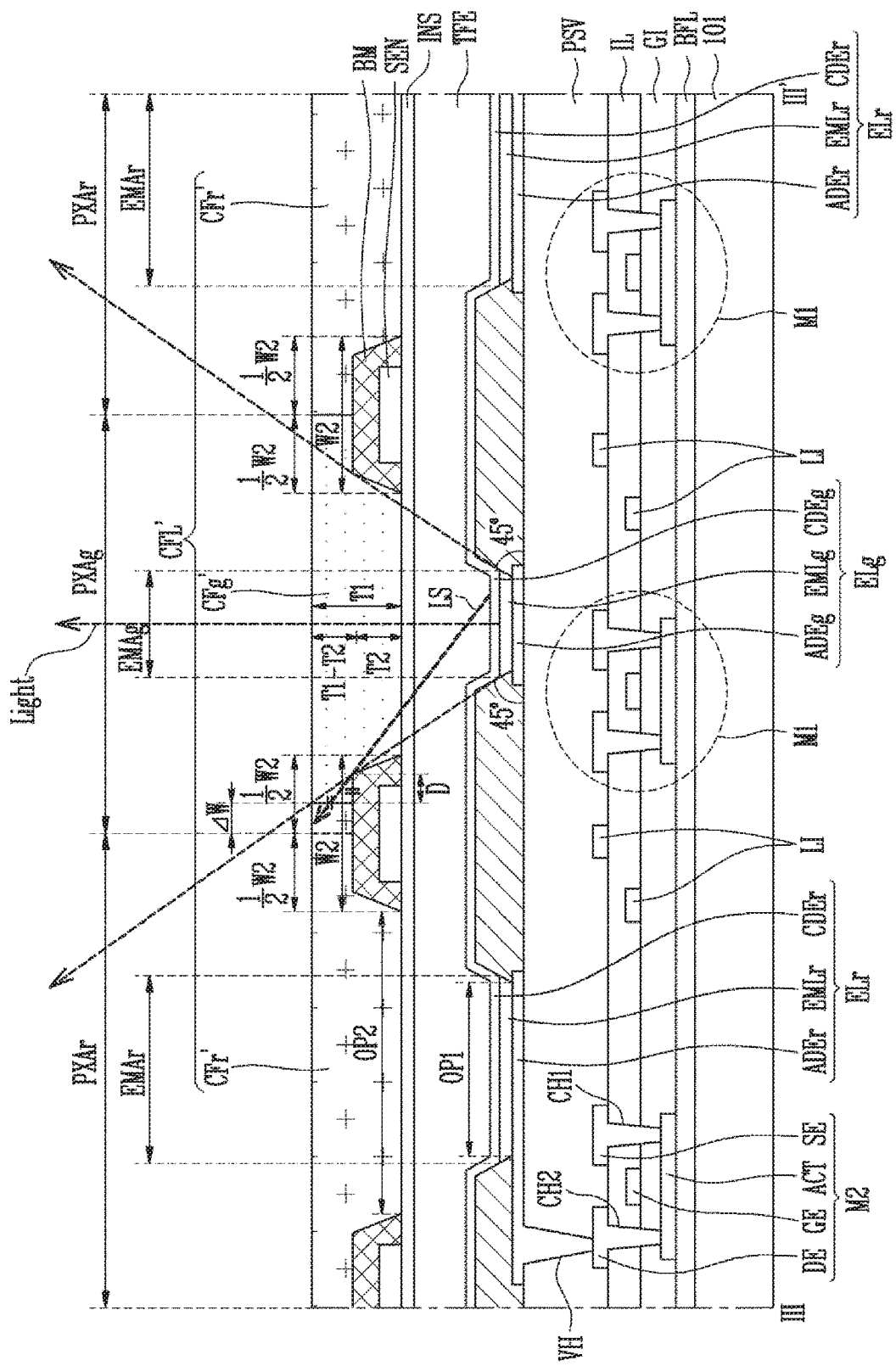
FIG. 9 illustrates an example of a cross section taken along line III-III' of FIG. 8.

FIG. 8 illustrates a partial area of a display panel according to another embodiment of the present disclosure, and FIG. 9 illustrates an example of a cross section taken along line III-III' of FIG. 8. In FIGS. 8 and 9, the same or similar components as those of the previously described embodiment are denoted by the same reference numerals, and a detailed description thereof will be omitted.

Referring to FIGS. 8 to 9, a display panel 100' according to the present embodiment includes color filters CFr', CFg' and CFb' configured to be an asymmetric structure in consideration of an azimuth angle range, e.g., within the azimuth range of 300° to 330° where a greenish reflection color pattern defect occurs most strongly.

For example, when one green pixel 110g and one red pixel 110r are successively disposed adjacent to each other along the first direction DR1 set in the northwestern direction, a red color filter CFr' disposed on the red pixel 110r may be expanded in the direction toward the green pixel 110g at the boundary between the red pixel 110r and the green pixel 110g disposed at the southeast of the red pixel 110r. For example, the lower right region of the red color filter CFr' may be expanded in the direction of the neighboring green pixel 110g by a set or predetermined width ΔW, and a green color filter CFg' disposed on the green pixel 110g or the size may be reduced by the expanded width ΔW of the red color filter CFr' in the upper left region. That is, a boundary line between the corresponding green and red color filters CFg' and CFr' is shifted by a set or predetermined distance (e.g., the distance corresponding to ΔW) in the direction toward the green pixel 110g at the boundary between a pair of green and red pixels 110g and 110r successively disposed along the first direction DR1. The red color filter CFr' may have a greater width than the green color filter CFg' in the first direction DR1.

Similarly, a blue color filter CFb' disposed on the blue pixel 110b may be expanded in the direction toward the green pixel 110g at the boundary between the green and blue pixels 110g and 110b successively disposed adjacent to each other along the first direction DR1.

That is, in the present embodiment, the red color filter CFr' and the blue color filter CFb' are expanded by the set or predetermined width ΔW in the opposite direction of the first direction DR1. According to an embodiment, the red color filter CFr' and the blue color filter CFb' may be arranged on a path along which light Ls, diffusing in the direction from the green pixel 110g to the red or blue pixels 110r or 110b adjacent to the green pixel 110g, proceeds with an azimuth range where a greenish reflection color pattern occurs greatly (e.g., an azimuth range of 300° to 330°). However, the width of the adjacent green color filter CFg' is reduced as the width of the red and blue color filters CFr' and CFb' is expanded. Therefore, the width ΔW by which the red and blue color filters CFr' and CFb' are expanded may be set within a range in which a viewing angle of a set or predetermined range, for example, a viewing angle of at least 45°, may be ensured based on the green pixel 110g.

For example, at the boundary between the pair of the green and red pixels 110g and 110r (or a pair of the green and blue pixels 110g and 110b), the boundary line between the green and red color filters CFg' and CFr' (or the green and blue color filters CFg' and CFb') corresponding to the green and red pixels 110g and 110r (or the green and blue pixels 110g and 110b) may be at a position shifted from one end of a region of the black matrix BM which is adjacent to the green pixel 110g between the light emitting regions EMAg and EMAr of the green and red pixels 110g and 110r (or the emitting regions EMAg and EMAb of the green and blue pixels 110g and 110b) toward the red pixel 110r (or the blue pixel 110b) by a distance D corresponding to a difference between a thickness T1 of the green color filter CFg' and a thickness T2 of the black matrix BM.

The other end of the red color filter CFr' (or the blue color filter CFb') may be disposed at the same position as the embodiment of FIGS. 4 to 6. For example, the opposite end of the red color filter CFr' (or the blue color filter CFb') may not expand its width at the boundary with the neighboring green color filter CFg'.

Specifically, the first green pixel 110g, the red pixel 110r (or a blue pixel 110b) and the second green pixel 110g, which are successively arranged along the first direction DR1, are referred as a first pixel, a second pixel and a third pixel, respectively. Also, the first green color filter CFg', the red color filter CFr' (or the blue color filter CFb') and the second green color filter CFg' respectively disposed on the first pixel, the second pixel and the third pixel are referred as a first color filter, a second color filter and a third color filter, respectively. A boundary line between the first and second color filters may be shifted from a central point of the black matrix BM disposed between light emitting regions of the first and second pixels toward the first pixel by a distance corresponding to the set or predetermined width W. A boundary line between the second and third color filters may be at a central point of the black matrix BM between light emitting regions of the second and third pixels.

That is, according to an embodiment, the second color filter may have an asymmetric structure in which a width of the second color filter in the first pixel direction is greater than a width thereof in the third pixel direction with respect to a center of the light emitting region of the second pixel. On the other hand, a width of the first color filter may be reduced by an expanded width of the second color filter at a boundary region between the first and second pixels. A width (or a position) of the third color filter at a boundary region between the second and third pixels may not be changed. However, a width of the third color filter at a boundary region between the third pixel and the second red pixel 110r (hereinafter, "a fourth pixel") which is disposed next to the third pixel along the first direction DR1 may be reduced. In other words, the first and third color filters may also have an asymmetric structure in which both sides are configured to have different widths in the first direction DR1 with respect to centers of the light emitting regions of the first and third pixels, respectively. In this way, the asymmetric structure of the red, green and blue color filters CFr', CFg' and CFb' may be repeated throughout a color filter layer CFL'.

As described above, in the present embodiment, on a progress path of reflected light Ls irregularly reflected by the green pixels 110g in a specific direction (e.g., the first direction DR1) and/or in a specific range of azimuth, expanded color filters of adjacent pixels (e.g., neighboring red or blue pixels 110r or 110b) are disposed by expanding color filters of adjacent pixels. Accordingly, the green wavelength component of the reflected light Ls which is transmitted through the green color filter CFg' is blocked by a color filter of a different wavelength (e.g., the red or blue color filter CFr' or CFb').

Therefore, according to the above-described embodiment, it is possible to mitigate or prevent the reflection color pattern defect, particularly the greenish reflection color pattern defect. Accordingly, the image quality of the display device 10 may be improved.

Also, in the above-described embodiment, the display panel 100' may be configured as an optical filter and/or sensor integrated display panel. Therefore, it is possible to reduce the thickness of the display device 10 while exhibiting excellent image quality characteristics and providing sensor function. Accordingly, flexibility of the display device 10 may be enhanced while ensuring the quality and multi-functional characteristics.

According to an embodiment of the present disclosure, it is possible to reduce or prevent a reflection color pattern defect, for example, a striped greenish reflection color pattern defect caused by irregular (diffuse) reflection (or asymmetric reflection) in a display panel. Therefore, the image quality of the display device may be improved.

Further, according to an embodiment of the present disclosure, the thickness of the display device may be reduced while ensuring excellent image quality and multifunctional characteristics by configuring an optical filter and/or a sensor integrated display panel.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:
1. A display device comprising:
 a first pixel and a second pixel successively arranged along a first direction;
 a first color filter on the first pixel;
 a second color filter arranged on the second pixel to be adjacent to the first color filter along the first direction; and
 a black matrix overlapping the first color filter and the second color filter at a boundary between the first pixel and the second pixel, wherein the second color filter is expanded in a direction toward the first pixel at a boundary between the first pixel and the second pixel, and wherein, in the first direction, a width of an overlapping region of the black matrix and the first color filter is smaller than a width of an overlapping region of the black matrix and the second color filter.

2. The display device of claim 1, wherein the second color filter has a greater width than the first color filter in the first direction.

3. The display device of claim 1, wherein:
the first pixel is a green pixel, and
the second pixel is a red or blue pixel.

4. The display device of claim 1, wherein the second pixel is arranged in a northwestern direction of the first pixel.

5. The display device of claim 1, wherein the second color filter is arranged on a path along which light travels in a direction from the first pixel toward the second pixel in an azimuth range of 300° to 330°.

6. The display device of claim 1, further comprising a display panel having a plurality of pixels including the first pixel and the second pixel, the display panel comprising:
a thin film encapsulation layer covering the pixels;
a color filter layer on the thin film encapsulation layer, the color filter layer including the first color filter and the second color filter; and
the black matrix between the thin film encapsulation layer and the color filter layer, the black matrix covering boundary regions of the plurality of pixels and having a plurality of openings exposing at least respective light emitting regions of the pixels.

7. The display device of claim 6, wherein each of the openings in the black matrix is wider than a corresponding one of the light emitting regions in a region corresponding to a corresponding one of the pixels to ensure a viewing angle of a set range.

8. The display device of claim 7, wherein:
a region of the black matrix is between a light emitting region of the first pixel and a light emitting region of the second pixel, and
a boundary line between the first and second color filters is at a position shifted from one end of the region of the black matrix adjacent to the light emitting region of the first pixel toward the second pixel by a distance corresponding to a difference between a thickness of the first color filter and a thickness of the black matrix.

9. The display device of claim 6, wherein:
each of the pixels comprises a light emitting element including a first electrode, a light emitting layer and a second electrode sequentially arranged in a corresponding one of the light emitting regions, and
the display panel further comprises a pixel defining layer between the respective light emitting regions of the pixels and having openings each exposing the first electrode in a corresponding one of the light emitting regions.

10. The display device of claim 9, wherein:
the black matrix is on the pixel defining layer, and
the openings of the black matrix overlap the openings of the pixel defining layer and have a greater area than the openings of the pixel defining layer.

11. The display device of claim 6, wherein the display panel further comprises:
a third pixel arranged next to the second pixel in the first direction; and
a third color filter on the third pixel.

12. The display device of claim 11, wherein a boundary line between the second color filter and the third color filter is at a central point of the black matrix disposed between a light emitting region of the second pixel and a light emitting region of the third pixel.

13. The display device of claim 11, wherein the second color filter has an asymmetric structure in which a width of the second color filter in a first pixel direction is greater than a width thereof in a third pixel direction with respect to a center of a light emitting region of the second pixel.

14. The display device of claim 11, wherein the third pixel is configured to emit light of a same color as the first pixel.

15. The display device of claim 6, further comprising a sensor electrode disposed between the thin film encapsulation layer and the black matrix.

16. A display device comprising:
a first pixel and a second pixel successively arranged along a first direction;
a first color filter on the first pixel;
a second color filter arranged on the second pixel to be adjacent to the first color filter along the first direction; and
a black matrix overlapping the first color filter and the second color filter at a boundary between the first pixel and the second pixel,
wherein the second color filter is greater in width than the first color filter in the first direction in a plan view of the second color filter and the first color filter, and
wherein, in the first direction, the black matrix and the first color filter are smaller in overlapping width than the black matrix and the second color filter.

17. A display device comprising:
a first pixel, a second pixel and a third pixel successively arranged along a first direction;
a first color filter on the first pixel;
a second color filter arranged on the second pixel to be adjacent to the first color filter along the first direction;
a third color filter on the third pixel to be adjacent to the second color filter along the first direction; and
a black matrix overlapping the first color filter and the second color filter at a boundary between the first pixel and the second pixel,
wherein the second color filter has an asymmetric structure in which a width of the second color filter in a first pixel direction is greater than a width thereof in a third pixel direction with respect to a center of a light emitting region of the second pixel, and
wherein, in the first direction, the black matrix and the first color filter are smaller in overlapping width than the black matrix and the second color filter.

18. The display device of claim 17, wherein the third pixel is configured to emit light of a same color as the first pixel and a different color as the second pixel.

* * * * *